US006898087B1

(12) United States Patent
Chen

(10) Patent No.: US 6,898,087 B1
(45) Date of Patent: May 24, 2005

(54) RESILIENT ELEMENT

(76) Inventor: Wei-Chen Chen, 1F, No. 6, Alley 6, Pao-Hsing Rd, Hsin-Tien City, Taipei Hsien (TW)

( * ) Notice: Subject to any disclaimer, the term of this patent is extended or adjusted under 35 U.S.C. 154(b) by 0 days.

(21) Appl. No.: 10/747,637

(22) Filed: Dec. 29, 2003

(51) Int. Cl.[7] ........................ H05K 1/14; H01R 12/14; H01B 5/00

(52) U.S. Cl. ...................... 361/804; 361/742; 361/758; 361/770; 439/66; 174/138 G

(58) Field of Search ................................ 361/735, 742, 361/758, 770, 804, 807–810, 796, 803; 174/138 G, 174/138 E; 439/65, 66, 30, 91, 591

(56) References Cited

U.S. PATENT DOCUMENTS 5,205,739 A * 4/1993 Malo et al. .................. 439/66
5,969,952 A * 10/1999 Hayashi et al. ............. 361/774
5,984,692 A * 11/1999 Kumagai et al. ............. 439/66
6,149,443 A * 11/2000 Moran ......................... 439/66
6,493,241 B1 * 12/2002 Horng ........................ 361/818

* cited by examiner

*Primary Examiner*—Kamand Cuneo
*Assistant Examiner*—Dameon E. Levi
(74) *Attorney, Agent, or Firm*—Law Office of Kenneth C. Brooks

(57) ABSTRACT

A resilient element includes interconnected lower and upper parts. The lower part includes a planar bottom segment having front and rear ends, a first curved segment that curves upwardly and rearwardly from the front end of the planar bottom segment, and a second curved segment that curves upwardly and forwardly from the rear end of the planar bottom segment. The upper part includes a planar top portion having front and rear ends, a first curved portion that curves downwardly and rearwardly from the front end of the planar top portion, and a second curved portion that curves downwardly and forwardly from the rear end of the planar top portion. The first curved segment and the second curved portion have interconnected distal ends.

19 Claims, 2 Drawing Sheets

RESILIENT ELEMENT

BACKGROUND OF THE INVENTION

1. Field of the Invention

The present invention relates to a resilient element, more particularly to a surface mountable resilient conductive element that has a simple and durable construction.

2. Description of the Related Art

Referring to FIGS. 1 and 2, a conventional surface mountable resilient conductive element 1 is shown to be formed from a unitary conductive strip that is made of metal and that is bent to configure the resilient conductive element 1 with a planar top portion 12, a planar bottom portion 10 disposed below and parallel to the planar top portion 12, an inclined arm portion 11 that interconnects a rear end of the planar top portion 12 and a front end of the planar bottom portion 10, an upper extension portion 14 that extends downwardly, inclinedly and rearwardly from a front end of the planar top portion 12 through a lower hole 112 in the inclined arm portion 11, and a lower extension portion 13 that extends upwardly, inclinedly and forwardly from a rear end of the planar bottom portion 10 through an upper hole 111 in the inclined arm portion 11. Each of the upper and lower extension portions 14, 13 is formed with a distal curved end 141, 131. The planar top portion 12 is adapted to be acted upon by a suction device (not shown) for moving the resilient conductive element 1 during a surface mounting operation.

As shown in FIG. 3, when the planar top portion 12 is subjected to a downward force, elastic deformation of the resilient conductive element 1 occurs at the junctions of the planar top and bottom portions 12, 10 with the inclined arm portion 11. As the planar top portion 12 moves toward the planar bottom portion 10, the distal curved ends 141, 131 of the upper and lower extension portions 14, 13 eventually abut against the planar bottom and top portions 10, 12, respectively, thereby resulting in increased resistance to further deformation of the resilient conductive element 1. On the other hand, since the resilient conductive element 1 is used for making electrical or grounding connection between an electrical device (not shown) thereabove and a contact pad (not shown) of a circuit board (not shown) therebelow, when the planar top portion 12 is pressed toward the planar bottom portion 10, a reduction in contact resistance results in view of contact between the planar top and bottom portions 12, 10 and the distal curved end 131, 141 of the respective one of the lower and upper extension portions 13, 14.

The following are some of the drawbacks of the aforesaid conventional resilient conductive element 1:

1. The mechanical strength of the resilient conductive element 1 is compromised in view of the presence of the upper and lower holes 111, 112 in the inclined arm portion 11.

2. Manufacturing of the resilient conductive element 1 is done manually and cannot be automated due to the need to extend the upper and lower extension portions 14, 13 through the lower and upper holes 112, 111 in the inclined arm portion 11, which results in low production efficiency, poor precision, and increased costs.

3. Since the resilient conductive element 1 is bent by hand, it is not possible to shrink the size of the resilient conductive element 1 further.

SUMMARY OF THE INVENTION

Therefore, the object of the present invention is to provide a resilient element that can be overcome the aforesaid drawbacks of the prior art.

Accordingly, a resilient element of the present invention comprises interconnected lower and upper parts. The lower part includes a planar bottom segment having front and rear ends, a first curved segment that curves upwardly and rearwardly from the front end of the planar bottom segment, and a second curved segment that curves upwardly and forwardly from the rear end of the planar bottom segment. The upper part includes a planar top portion that has front and rear ends and that is disposed above and substantially parallel to the planar bottom segment, a first curved portion that curves downwardly and rearwardly from the front end of the planar top portion and that is disposed above the first curved segment, and a second curved portion that curves downwardly and forwardly from the rear end of the planar top portion and that is disposed above the second curved segment. The first curved segment and the second curved portion have interconnected distal ends.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
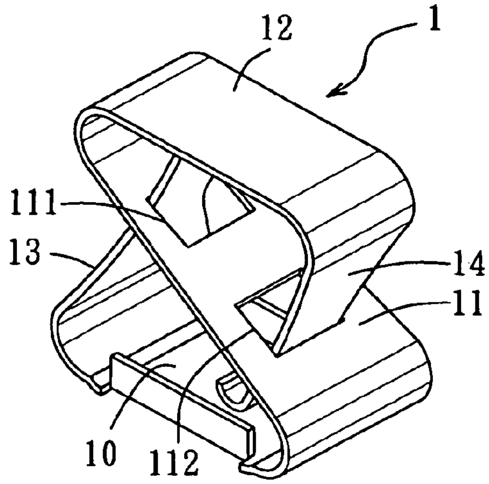
FIG. 1 PRIOR ART
FIG. 1 is a perspective view of a conventional resilient conductive element.
Figure 2:
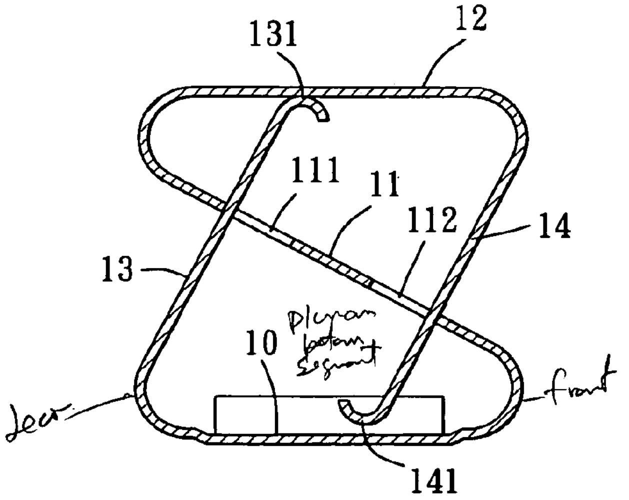
FIG. 2 PRIOR ART
FIG. 2 is a sectional view of the conventional resilient conductive element.
Figure 3:
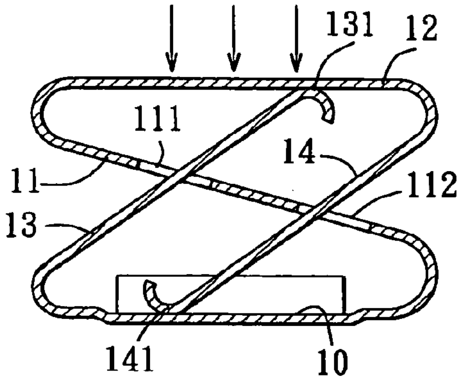
FIG. 3 PRIOR ART
FIG. 3 is a sectional view to illustrate a compressed state of the conventional resilient conductive element.
Figure 4:
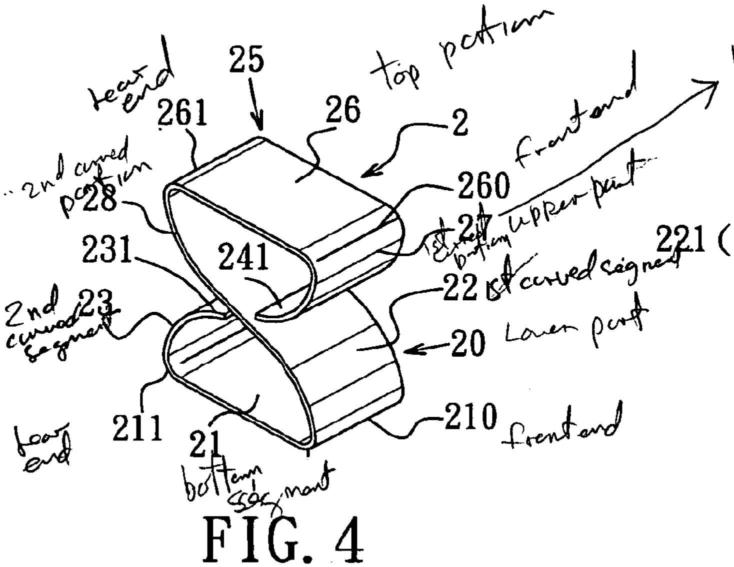
FIG. 4 is a perspective view of the preferred embodiment of a resilient element according to the present invention.
Figure 5:
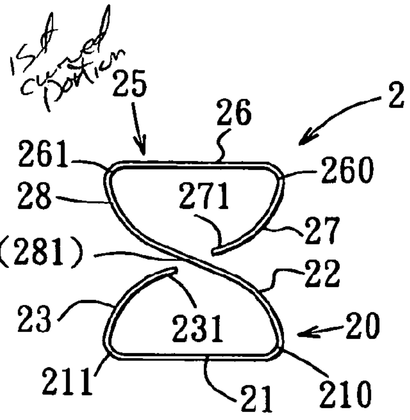
FIG. 5 is a sectional view of the preferred embodiment.

Referring to FIGS. 4 and 5, a resilient element according to the present invention is shown to be embodied in a surface mountable resilient conductive element 2 that is formed from a unitary conductive strip made of metal and bent to configure the resilient conductive element 2 with interconnected lower and upper parts 20, 25. The lower part 20 includes a planar bottom segment 21 that has front and rear ends 210, 211, a first curved segment 22 that curves upwardly and rearwardly from the front end 210 of the planar bottom segment 21, and a second curved segment 23 that curves upwardly and forwardly from the rear end 211 of the planar bottom segment 21. The upper part 25 includes a planar top portion 26 that has front and rear ends 260, 261 and that is disposed above and substantially parallel to the planar bottom segment 21 of the lower part 20, a first curved portion 27 that curves downwardly and rearwardly from the front end 260 of the planar top portion 26 and that is disposed above the first curved segment 22 of the lower part 20, and a second curved portion 28 that curves downwardly and forwardly from the rear end 261 of the planar top portion 26 and that is disposed above the second curved segment 23 of the lower part 20. The first curved segment 22 of the lower part 20 and the second curved portion 28 of the upper part 25 have interconnected distal ends 221, 281. In addition, each of the second curved segment 23 of the lower part 20 and the first curved portion 27 of the upper part 25 has a distal end 231, 271.

Figure 6:
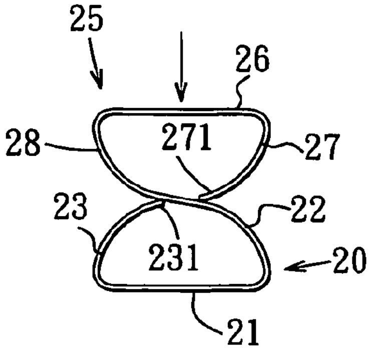
FIGS. 6 and 7 are sectional views to illustrate compressed states of the preferred embodiment.
Figure 7:
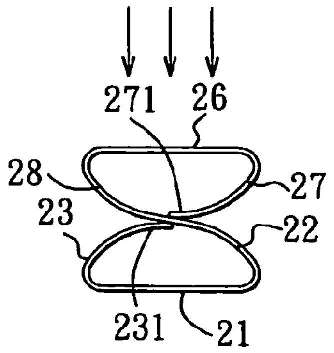

Referring to FIG. 6, when the planar top portion 26 is subjected to a slight downward force, elastic deformation of the resilient conductive element 2 occurs initially at the second curved portion 28 of the upper part 25 and the first curved segment 22 of the lower part 20 such that the second curved portion 28 and the first curved segment 22 are brought into contact with the distal ends 231, 271 of the second curved segment 23 and the first curved portion 27, respectively. As a result, the Young's modulus of the resilient conductive element 2 is increased to result in increased resistance to further deformation of the resilient conductive element 2. As shown in FIG. 7, even when the downward force applied on the planar top portion 26 is increased, the planar top portion 26 is prevented from coming into contact with the planar bottom segment 21 to minimize the risk of permanent deformation of the resilient conductive element 2. Moreover, contact among the distal ends 231, 271 of the second curved segment 23 and the first curved portion 27, the second curved portion 28 of the upper part 25, and the first curved segment 22 of the lower part 20 results in additional conductive routes, which reduce contact resistance of the resilient conductive element 2 from 5–7 mΩ to 2–3 mΩ.

Since the entire length of the resilient conductive element 2 is not formed with any hole therethrough, the mechanical strength thereof is not compromised. Moreover, in view of its simple structure, it only requires one punching operation and four bending operations to fabricate the resilient conductive element 2. Therefore, the resilient conductive element 2 can be fabricated in an automated manner to result in higher production efficiency, good precision, and lower costs. Moreover, since bending need not be conducted by hand, the size of the resilient conductive element 2 can be shrunk further to comply with current trends toward miniaturization.

It should be noted herein that, while the shapes of the first and second curved segments 22, 23 of the lower part 20 are shown to be generally symmetrical to those of the first and second curved portions 27, 28 of the upper part 25 in the disclosed embodiment, those skilled in the art can appreciate that the shapes thereof should not be limited thereto and can be actually modified in practice.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A resilient element comprising:

interconnected lower and upper parts, said lower part including a planar bottom segment having front and rear ends, a first curved segment that curves upwardly and rearwardly from said front end of said planar bottom segment, and a second curved segment that curves upwardly and forwardly from said rear end of said planar bottom segment, terminating in a first end, said upper part including a planar top portion, disposed above and substantially parallel to said planar bottom segment, having front and rear ends, a first curved portion that curves downwardly and rearwardly from said front end of said planar top portion, terminating in a second end, and a second curved portion, disposed above said first curved segment, curving downwardly and forwardly from said rear end of said planar top portion, and a second curved portion that curves downwardly and forwardly from said rear end of said planar top portion and that is disposed above said second curved segment, said first curved segment and said second curved portion having interconnected distal ends, with said first end being disposed between said interconnected distal ends and said planar bottom segment and said second end being disposed between said interconnected distal ends and said planar top portion.

2. The element as recited in claim 1 wherein said upper and lower parts are in superimposition.

3. The element as recited in claim 1 wherein said first and second planar segments are in superimposition with said interconnected distal ends extending therebetween.

4. The element as recited in claim 1 wherein said interconnected distal ends extend between said first curved segment and said second curved portion and is devoid of apertures.

5. The element as recited in claim 1 wherein said first and second ends are arranged to contact said interconnected distal ends upon a force being exerted upon one of said planar bottom segment and said planar top portion.

6. The element as recited in claim 5 wherein said upper and lower parts are integrally formed.

7. A resilient conductive element comprising:

a unitary conductive strip that is bent to form interconnected lower and upper parts, said lower part including a planar bottom segment having front and rear ends, a first curved segment that curved upwardly and rearwardly from said front end of said planar bottom segment, and a second curved segment that curved upwardly and forwardly from said rear end of said planar bottom segment, terminating in a first end, said upper part including a planar top portion that has front and rear ends and that disposed above and substantially parallel to said planar bottom segment, a first curved portion that curves downwardly and rearwardly from said front end of said planar top portion and that is disposed above said first curved segment, and a second curved portion that curves downwardly and forwardly from said rear end of said planar top portion, terminating in a second end and that is disposed above said second curved segment, said first curved segment and said second curved portion having interconnected distal ends, with said first end being disposed between said interconnected distal ends and said planar bottom segment and said second end being disposed between said interconnected distal ends and said planar top portion.

8. The element as recited in claim 7 wherein said upper and lower parts are in superimposition.

9. The element as recited in claim 7 wherein said first and second planar segments are in superimposition with said interconnected distal ends extending therebetween.

10. The element as recited in claim 7 wherein said interconnected distal ends extend between said first curved segment and said second curved portion and is devoid of apertures.

11. The element as recited in claim 7 wherein said first and second ends are arranged to contact said interconnected distal ends upon a force being exerted upon one of said planar bottom segment and said planar top portion.

12. A resilient element, comprising:

a body extending from a first end, terminating in a second end disposed opposite to said first end and spaced-apart therefrom, defining first and second curved portions with an interconnection region extending therebetween, with said first and second ends being positioned proximate to said interconnected region.

13. The element as recited in claim 12 wherein said first and second curved portions are disposed on opposing sides of said interconnection region.

14. The element as recited in claim 12 wherein said first curved portion includes a first planar segment and said second curved portion includes a second planar segment.

15. The element as recited in claim 12 wherein said first and second curved portions are in superimposition.

16. The element as recited in claim 12 wherein said first curved portion includes a first planar segment and said second curved portion includes a second planar segment, with said first and second planar segments being in superimposition.

17. The element as recited in claim 12 wherein said first curved portion includes a first planar segment and said second curved portion includes a second planar segment, with said interconnected region being disposed between said first and second planar segments and said first and second ends being disposed on opposing sides of said interconnected region.

18. The element as recited in claim 12 wherein said first curved portion includes a first planar segment and said second curved portion includes a second planar segment, with said interconnected region being disposed between said first and second planar segments and said first end being disposed between said interconnected region and said first planar segment and said second end being disposed between said second curved portion and said interconnected region.

19. The element as recited in claim 12 wherein said first and second ends are arranged to contact said interconnected region upon a force being exerted upon one of said first and second curved bodies.

* * * * *